US006400286B1

United States Patent
Cooper

(10) Patent No.: US 6,400,286 B1
(45) Date of Patent: Jun. 4, 2002

(54) DATA COMPRESSION METHOD AND APPARATUS IMPLEMENTED WITH LIMITED LENGTH CHARACTER TABLES

(75) Inventor: Albert B. Cooper, New York, NY (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/885,400

(22) Filed: Jun. 20, 2001

(51) Int. Cl.$^7$ .............................. H03M 7/38; H03M 7/00
(52) U.S. Cl. .......................................... 341/51; 341/106
(58) Field of Search ............................ 341/95, 51, 106, 341/87

(56) References Cited

U.S. PATENT DOCUMENTS

| | | | |
|---|---|---|---|
| 4,558,302 A | | 12/1985 | Welch .......................... 340/51 |
| 5,049,881 A | * | 9/1991 | Gibson et al. ................. 341/95 |
| 5,151,697 A | * | 9/1992 | Bunton ........................ 341/51 |
| 5,153,591 A | | 10/1992 | Clark ........................... 341/51 |
| 5,373,290 A | * | 12/1994 | Lempel et al. ................ 341/51 |
| 5,389,922 A | * | 2/1995 | Seroussi et al. .............. 341/51 |
| 5,455,576 A | * | 10/1995 | Clark, II et al. ............... 341/50 |
| 5,455,943 A | * | 10/1995 | Chambers, IV .............. 341/51 |
| 5,805,086 A | * | 9/1998 | Brown et al. ................. 341/51 |
| 5,951,623 A | * | 9/1999 | Reynar et al. ................ 341/95 |

* cited by examiner

Primary Examiner—Peguy JeanPierre
Assistant Examiner—Jean Bruner Jeanglaude
(74) Attorney, Agent, or Firm—Albert B. Cooper; Mark T. Starr

(57) ABSTRACT

A new LZW compressor implementation architecture utilizes a plurality of limited length character tables corresponding to the respective characters of the alphabet. A string is stored by storing the code associated with the string in the character table corresponding to the extension character of the string at a character table location corresponding to the code of the string prefix. A character table is created when the character corresponding thereto is first encountered in the input. The input data character stream is searched by comparing the input stream to the stored strings to determine longest matches therewith. The codes associated with the longest matched strings are outputted so as to provide an output stream of compressed codes. The respective lengths of the character tables are limited in accordance with the frequency of occurrence of the characters of the alphabet. If a character table is limited in length to a number of strings less than a predetermined threshold, the character table is excluded from creation. The stored strings are updated by inserting extended strings into the character tables, terminating storage into a character table when the table is full. Additionally, an extended string is excluded from storage when the appropriate character table therefor is excluded from creation.

34 Claims, 5 Drawing Sheets

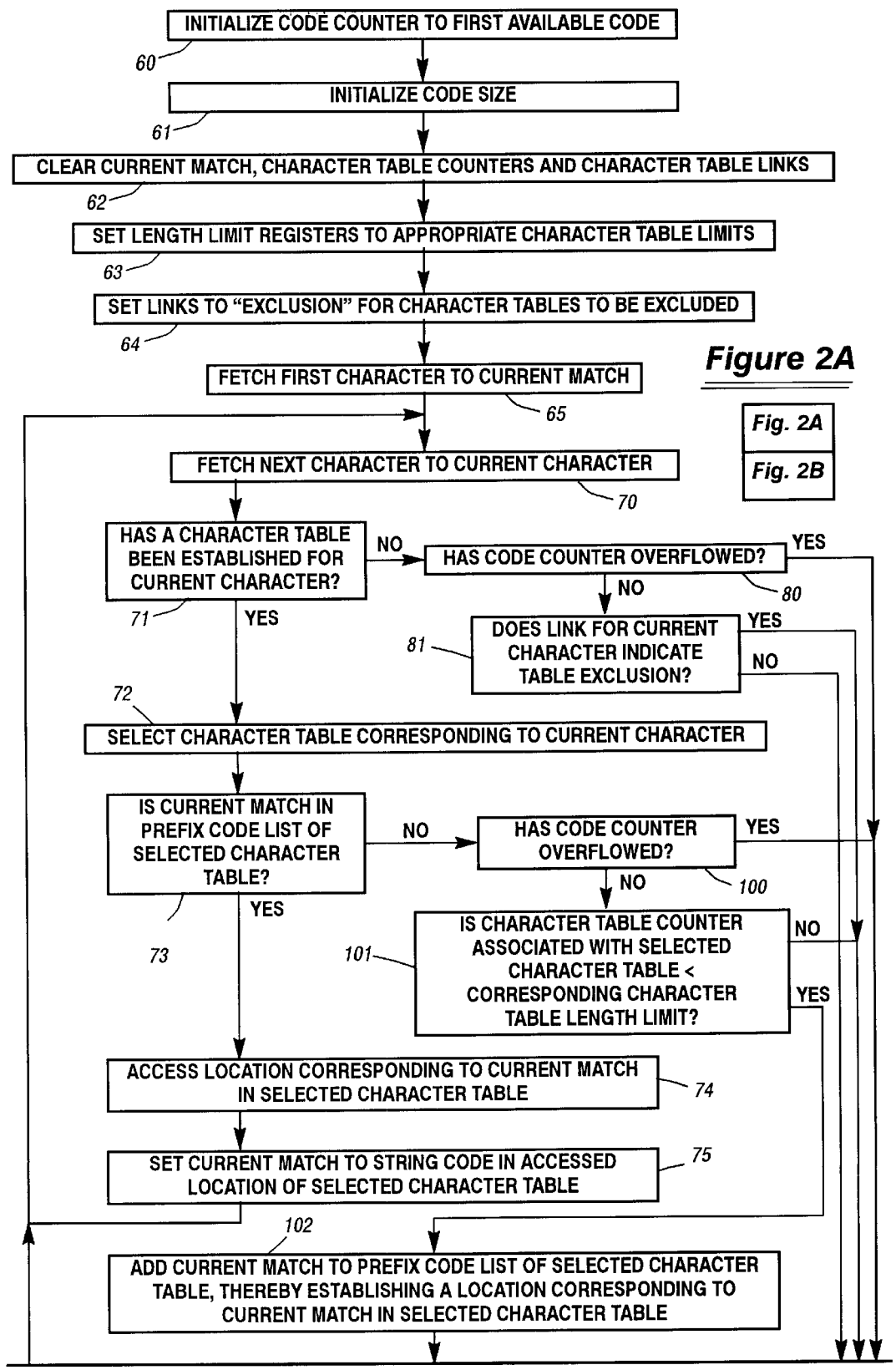

INPUT DATA CHARACTER STREAM $a_1\ b_1\ a_2\ b_2\ x_1\ b_3\ a_3\ b_4\ a_4\ x_2\ a_5\ b_5\ b_6\ a_6\ a_7\ b_7\ z_1\ b_8\ a_8\ a_9\ b_9$

| ACTION | CURR MTCH | CURR CHAR | CODE CNTR | CHAR TBLE | PRE FIX | STRING CODE | CHAR TBLE CNTR | OUT PUT | BLOCKS OF FIG. 2 |
|---|---|---|---|---|---|---|---|---|---|
| 1 | $a_1$ | $b_1$ | 5 | b | a | 5 | 1 | - | 60-65,70,71,80-84 |
| 2 | $b_1$ | $a_2$ | 6 | a | b | 6 | 1 | $a_1$ | 90-94,70,71-80-84 |
| 3 | $a_2$ | $b_2$ | 7 | b | a | (5) | | $b_1$ | 90-94,70-74 |
| 4 | 5 | $x_1$ | | x | 5 | 7 | 1 | | 75,70,71,80-84 |
| 5 | $x_1$ | $b_3$ | 8 | b | x | 8 | 2 | 5 | 90-94,70-73,100-103,84 |
| 6 | $b_3$ | $a_3$ | 9 | a | b | (6) | | $x_1$ | 90-94,70-74 |
| 7 | 6 | $b_4$ | | b | 6 | 9 | 3 | | 75,70-73,100-103,84 |
| 8 | $b_4$ | $a_4$ | 10 | a | b | (6) | | 6 | 90-94,70-74 |
| 9 | 6 | $x_2$ | | x | | | | | 75,70-73,100,101 |
| 10 | $x_2$ | $a_5$ | 11 | a | x | 11 | 2 | 6 | 90-94,70-73,100-103,84 |
| 11 | $a_5$ | $b_5$ | 12 | b | a | (5) | | $x_2$ | 90-94,70-74 |
| 12 | 5 | $b_6$ | | b | 5 | 12 | 4 | | 75,70-73,100-103,84 |
| 13 | $b_6$ | $a_6$ | 13 | a | b | (6) | | 5 | 90-94,70-74 |
| 14 | 6 | $a_7$ | | a | 6 | 13 | 3 | | 75,70-73,100-103,84 |
| 15 | $a_7$ | $b_7$ | 14 | b | a | (5) | | 6 | 90-94,70-74 |
| 16 | 5 | $z_1$ | | | | | | | 75,70,71,80,81 |
| 17 | $z_1$ | $b_8$ | 15 | b | z | 15 | 5 | 5 | 90-94,70-73,100-103,84 |
| 18 | $b_8$ | $a_8$ | OVFL | a | b | (6) | | $z_1$ | 90-94,70-74 |
| 19 | 6 | $a_9$ | | a | 6 | (13) | | | 75,70-74 |
| 20 | 13 | $b_9$ | | b | | | | | 75,70-73,100 |
| 21 | $b_9$ | | | | | | | 13 | 93,94 |
| 22 | | | | | | | | $b_9$ | 70,93,END |

*Figure 3*

DATA COMPRESSION METHOD AND APPARATUS IMPLEMENTED WITH LIMITED LENGTH CHARACTER TABLES

CROSS REFERENCE TO RELATED APPLICATIONS

U.S. Pat. application Ser. No. 09/855,127 "Character Table Implemented Data Compression Method And Apparatus" by Cooper, filed May 14, 2001, discloses a character table implementation for LZ dictionary type compressors.

U.S. Pat. application Ser. No. 09/688,604 "Data Compression And Decompression Method And Apparatus With Embedded Filtering Of Infrequently Encountered Strings" by Cooper, filed Oct. 16, 2000, discloses an LZ dictionary type data compression and decompression system that excludes infrequently encountered strings from storage in the dictionary.

U.S. Pat. application Ser. No. 09/801,358 "Data Compression And Decompression Method And Apparatus With Embedded Filtering Of Dynamically Variable Infrequently Encountered Strings" by Cooper, filed Mar. 7, 2001, discloses a data compression and decompression system similar to that of said Ser. No. 09/688,604 with the additional capability of dynamically determining the strings to be excluded from storage.

BACKGROUND OF THE INVENTION

1. Field of the Invention

The invention relates to LZ data compression systems particularly with respect to the LZW compression methodology. More particularly, the invention relates to the architecture and protocols for storing and accessing data character strings in the compressor utilizing the character table implementation disclosed in said Ser. No. 09/855,127. In the present invention, limited length character tables are utilized to provide selective string storage.

2. Description of the Prior Art

Professors Abraham Lempel and Jacob Ziv provided the theoretical basis for LZ data compression and decompression systems that are in present day widespread usage. Two of their seminal papers appear in the IEEE Transactions on Information Theory, IT-23-3, May 1977, pp. 337–343 and in the IEEE Transactions on Information Theory, IT-24-5, September 1978, pp. 530–536. A ubiquitously used data compression and decompression system known as LZW, adopted as the standard for V.42 bis modem compression and decompression, is described in U.S. Pat. No. 4,558,302 by Welch, issued Dec. 10, 1985. LZW has been adopted as the compression and decompression standard used in the GIF image communication protocol and is utilized in the TIFF image communication protocol. GIF is a development of CompuServe Incorporated and the name GIF is a Service Mark thereof. A reference to the GIF specification is found in GRAPHICS INTERCHANGE FORMAT, Version 89a, Jul. 31, 1990. TIFF is a development of Aldus Corporation and the name TIFF is a Trademark thereof. Reference to the TIFF specification is found in TIFF, Revision 6.0, Final—Jun. 3, 1992.

Further examples of LZ dictionary based compression and decompression systems are described in the following U.S. patents: U.S. Pat. No. 4,464,650 by Eastman et al., issued Aug. 7, 1984; U.S. Pat. No. 4,814,746 by Miller et al., issued Mar. 21, 1989; U.S. Pat. No. 4,876,541 by Storer, issued Oct. 24, 1989; U.S. Pat. No. 5,153,591 by Clark, issued Oct. 6, 1992; U.S. Pat. No. 5,373,290 by Lempel et al., issued Dec. 13, 1994; U.S. Pat. No. 5,838,264 by Cooper, issued Nov. 17, 1998; and U.S. Pat. No. 5,861,827 by Welch et al., issued Jan. 19, 1999.

In the above dictionary based LZ compression and decompression systems, the compressor and decompressor dictionaries may be initialized with all of the single character strings of the character alphabet. In some implementations, the single character strings are considered as recognized although not explicitly stored. In such systems the value of the single character may be utilized as its code and the first available code utilized for multiple character strings would have a value greater than the single character values. In this way the decompressor can distinguish between a single character string and a multiple character string and recover the characters thereof. For example, in the ASCII environment, the alphabet has an 8 bit character size supporting an alphabet of 256 characters. Thus, the characters have values of 0–255. The first available multiple character string code can, for example, be 258 where the codes 256 and 257 are utilized as control codes as is well known.

In the prior art dictionary based LZ compression systems, data character strings are stored and accessed in the compressor dictionary utilizing well known searchtree architectures and protocols. Typically, the searchtree is arranged in nodes where each node represents a character, and a string of characters is represented by a node-to-node path through the tree. When the input character stream has been matched in the dictionary tree up to a matched node, a next input character is fetched to determine if the string match will continue. Conventionally, a determination is made to ascertain if the fetched character is already stored as an extension node of the matched node. Various techniques are utilized to effect this determination such as hashing and sibling lists as are well understood in the art.

In the prior art dictionary based LZ compressors, specific methodologies often require that the dictionary be limited to a fixed size. For example, in the GIF protocol, the dictionary is limited to a maximum of 4096 string codes with a concomitant maximum code size of 12 bits. When filled to maximum capacity, the dictionary may be frozen and utilized with the extant stored strings to perform further compression until such time as it is desirable to clear the dictionary contents.

It is an objective of the present invention to favorably control the string storage so as to improve compressor performance.

SUMMARY OF THE INVENTION

The present invention utilizes a new string storage and access architecture and protocols which, it is believed, will improve the performance of LZ type data compression algorithms.

In the present invention, a plurality of character tables corresponding to the respective characters of the alphabet are utilized instead of the conventional searchtree structured dictionary. A string is stored by storing the code associated with the string in the character table corresponding to the extension character of the string at a character table location corresponding to the code of the string prefix. The input data character stream is searched by comparing the input stream to the stored strings to determine the longest match therewith. The codes associated with the longest matched strings are outputted so as to provide an output stream of compressed codes. The respective lengths of the character tables are limited in accordance with statistics associated with the respective characters of the alphabet. The stored strings are updated by inserting extended strings into the character tables terminating storage into a character table when the table is full.

BRIEF DESCRIPTION OF THE DRAWINGS

FIG. 3 is a chart exemplifying the operations of the compressor of FIG. 1 in accordance with the control flow chart of FIG. 2.

DESCRIPTION OF THE PREFERRED EMBODIMENT

The best mode embodiment described below, utilizing the limited length Character Table implementation architecture of the present invention, is predicated, generally, on the LZW methodology. The embodiment is implemented in a manner similar to that described above where the single character strings are considered as recognized by the compressor although not explicitly initialized therein.

The below described embodiment utilizes the Character Table implementation architecture described in said Ser. No. 09/855,127 which is incorporated herein by reference in its entirety. In the present invention, the lengths (i.e., the number of locations) of the character tables are limited so as to enhance the set of strings stored in the compressor. The Character Table lengths are selected to be generally proportional to the frequency of occurrence of the characters of the alphabet to which the respective Character Tables correspond. Additionally, a Character Table may be excluded if the number of locations allocated thereto is below a predetermined threshold.

The total locations allocated in the compressor for string storage are distributed among the non-excluded Character Tables in accordance with the frequency of occurrence of the alphabet characters. Conventionally, an LZW compressor generates approximately 4K string codes to fill the dictionary. In the present invention, the 4K storage locations are distributed among the non-excluded Character Tables. In a manner to be described, strings are stored in a Character Table until it is full. Subsequently encountered strings terminating in a character corresponding to a full Character Table are not stored. String storage continues in Character Tables that are not full until the Code Counter assigning string codes has attained maximum count.

Figure 1:
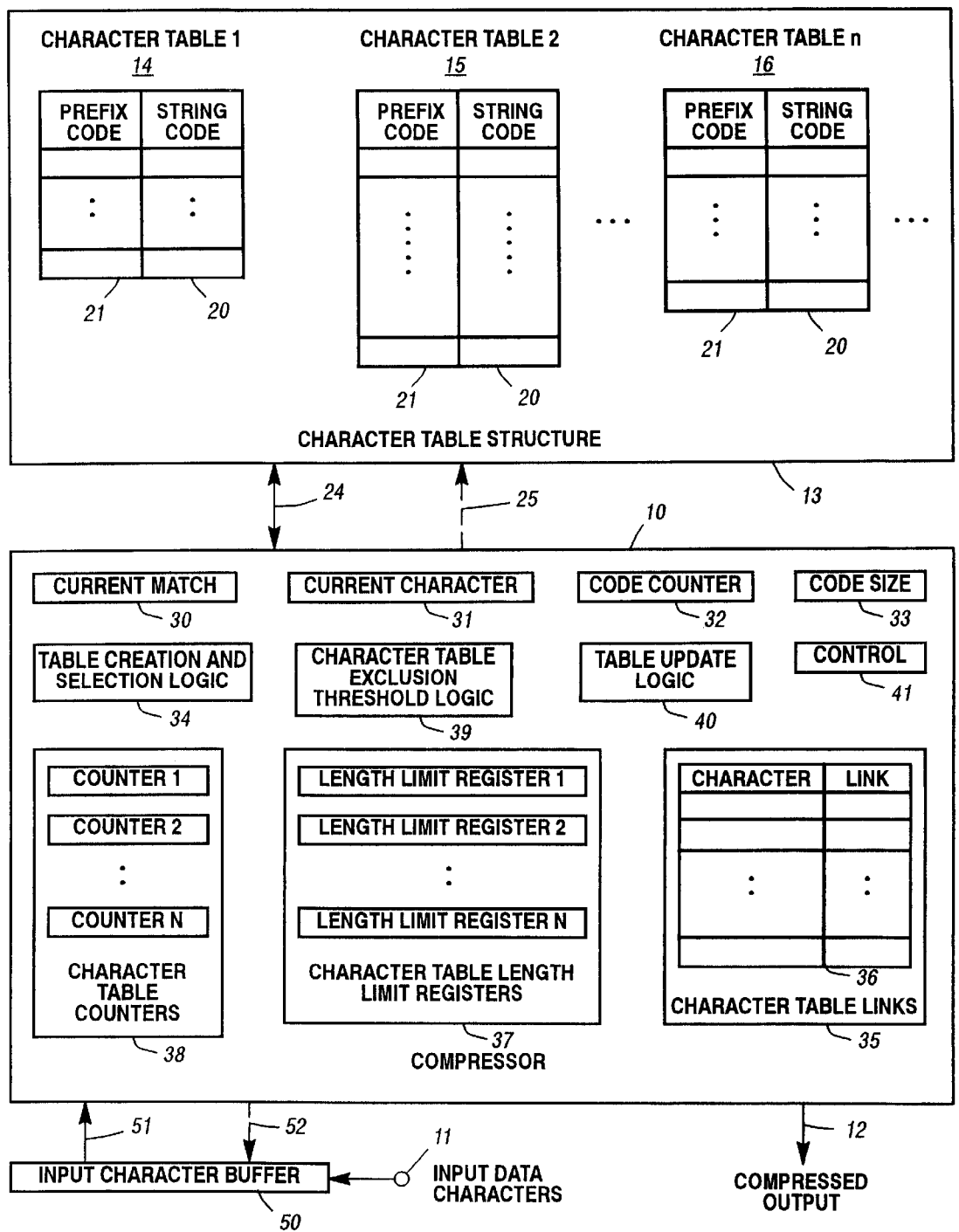
FIG. 1 is a schematic block diagram of a data compressor for compressing data in accordance with the present invention.

Referring to FIG. 1, a data compressor 10 is illustrated that compresses a stream of input data characters applied at an input 11 into a stream of corresponding compressed codes at an output 12. Included, in accordance with the invention, is Character Table Structure 13 comprising limited length Character Tables 14–16 corresponding to respective data characters of the alphabet over which compression is being performed. Each Character Table 14–16 is established when the input data character corresponding thereto is first encountered in the input. Each of the Character Tables 14–16 includes a location 20 in which to store the string code of a data character string stored in the Character Table Structure 13. Further included is a corresponding location in which to store the code of the prefix of the string. The stored prefix codes provide a Prefix Code List 21 with which to index and access the corresponding string codes 20.

A data character string is comprised of a prefix string of one or more characters followed by an extension character. A string is stored in the Character Table Structure 13 by storing the string code associated with the string in the Character Table 14–16 corresponding to the extension character of the string at a Character Table location 20 corresponding to the code of the string prefix. A location in a Character Table is established when the location is required in which to store an extended string. Data is communicated between the compressor 10 and the Character Table Structure 13 via a bi-directional data bus 24 under control of a control bus 25.

The compressor 10 includes a Current Match register 30, a Current Character register 31, a Code Counter 32 and a Code Size register 33. The Code Counter 32 sequentially generates code values to be assigned to data character strings stored in the Character Table Structure 13 in a manner to be described. The Code Size register 33 is utilized, as is well known, to control the number of bits utilized for transmitting the compressed code from the output 12.

Also included is Table creation and selection logic 34 and Character Table Links 35. The Table creation and selection logic 34 and the Character Table Links 35 are utilized for selecting the appropriate Character Table 14–16 in accordance with Current Character in a manner to be explained. In addition, the Table creation and selection logic 34 and the Character Table Links 35 are utilized in the "on-the-fly" creation of the Character Table Structure 13.

The Character Table Links 35 may be configured as a Directory 36 indexed by the individual characters of the alphabet to provide respective address links to the corresponding Character Tables in the Character Table Structure 13. If a link is not stored for an input data character, the Character Table for that character has not yet been established. When an input data character is first encountered by the compressor 10 and fetched into the Current Character register 31, the logic 34 selects an address link for storage in the Directory 36 to correspond to the newly encountered character. The logic 34 then creates the Character Table linked by the address so as to provide the Character Table corresponding to the character.

In accordance with one aspect of the invention, the compressor 10 includes Character Table Length Limit registers 37 and Character Table Counters 38 corresponding to the respective Character Tables of the Character Table Structure 13. Each of the registers 37 contains the Length Limit for the respective Character Table and each of the Character Table Counters 38 maintains a count of the number of strings entered into the associated Character Table. When a Counter 38 associated with a Character Table attains a count equal to the Length Limit in the associated register 37, the corresponding Character Table is considered to be full.

In accordance with another aspect of the invention, predetermined Character Tables are excluded from the Character Table Structure 13. For such Character Tables, the corresponding Link in the Directory 36 is marked to indicate Table exclusion.

Although one or more Character Tables may not be established or may be excluded for certain characters of the alphabet, the registers 37 and Counters 38 are illustrated for all N characters of the alphabet for convenience.

In a manner to be described below, configuration apparatus similar to the compressor 10 and the Character Table Structure 13 may be utilized to automatically determine the Length Limits to be inserted into the registers 37. Such configuration apparatus may also be utilized to determine which Character Tables should be excluded from the Character Table Structure 13. For this function, Character Table exclusion threshold logic 39 would be included in such configuration apparatus in a manner to be explained.

The compressor 10 further includes Table update logic 40 for updating the Character Tables of the Character Table Structure 13 with extended strings in a manner to be described. The compressor 10 additionally includes control 41 for controlling the operations of the compressor 10 in accordance with the operational flow chart of FIG. 2 to be described below.

Further included is an Input Character Buffer 50 that buffers the input data character stream received at the input 11. The input data characters are applied from the Input Character Buffer 50 via a bus 51 to the Current Character register 31 and the Current Match register 30 in accordance with operations to be described. The compressor 10 controls acquiring input data characters from the Input Character Buffer 50 via a control bus 52.

Briefly, the operation of the compressor 10 is as follows. The compressor 10 is initialized by setting the Code Counter 32 to the first available multiple character string code and by setting the Code Size register 33 to the initial Code Size. Additionally, the Current Match register 30, the Character Table Counters 38 and the Links of the Character Table Links 35 are cleared. Furthermore, the compressor 10 is configured by setting the Character Table Length Limit registers 37 to appropriate Character Table Length Limits and by setting the Links of the Character Table Links 35 to "Exclusion" for Character Tables to be excluded.

A first input data character is fetched to the Current Match register 30 to initiate a first compression cycle. To begin a subsequent compression cycle, the Current Match register 30 is set to contain the mismatching character determined from the preceding compression cycle.

At the beginning of a compression cycle, the next input data character is fetched to the Current Character register 31. If a Character Table has been established for Current Character, the Character Table corresponding thereto is selected. If Current Match is in the Prefix Code List 21 of the selected Character Table, the location corresponding to Current Match in the selected Character Table is accessed and the Current Match register 30 is set to the string code contained in the accessed location. The fetching of the next Current Character, the selection of the Character Table corresponding to Current Character, the accessing of the location corresponding to Current Match in the selected Character Table and the updating of Current Match with the string code in the accessed location continues until a Character Table has not been established for Current Character or Current Match is not in the Prefix Code List of the selected Character Table.

If a Character Table has not been established for Current Character and the associated Link for Current Character does not indicate Table exclusion, a Character Table corresponding to Current Character is established and Current Match is entered as the first entry in the Prefix Code List thereof. The code from the Code Counter 32 is stored in the location in the established Character Table corresponding to this first entry. Additionally, the Character Table Counter associated with the established Character Table is incremented by 1.

If Current Match is not in the Prefix Code List of the selected Character Table and the Character Table Counter associated with the selected Character Table is less than the corresponding Character Table Length Limit, Current Match is added to the Prefix Code List of the selected Character Table. The code from the Code Counter 32 is stored in the established location in the selected Character Table and the Character Table Counter associated with the selected Character Table is incremented by 1.

If, as described, the Character Table is established or the Prefix Code List of an established Character Table is updated, the Code Counter 32 is incremented to the next available code, the code in the Current Match register 30 is output as the longest match and the Current Match register 30 is set to the mismatching character residing in the Current Character register 31. Control returns to fetch the next data character to the Current Character register 31 to begin the search for the next longest match in the next compression cycle.

If, however, the Link for Current Character indicates Table exclusion or the Character Table Counter associated with the selected Character Table is not less than the corresponding Character Table Length Limit, the Character Table creation or Character Table updating as well as the incrementing of the associated Character Table Counter are bypassed.

If, as described above, a Character Table has not been established for Current Character or Current Match is not in the Prefix Code List of the selected Character Table and, in addition, the Code Counter 32 has overflowed, the Character Table creation or updating, the incrementing of the associated Character Table Counter and the incrementing of the Code Counter 32 are bypassed.

Figure 2B:
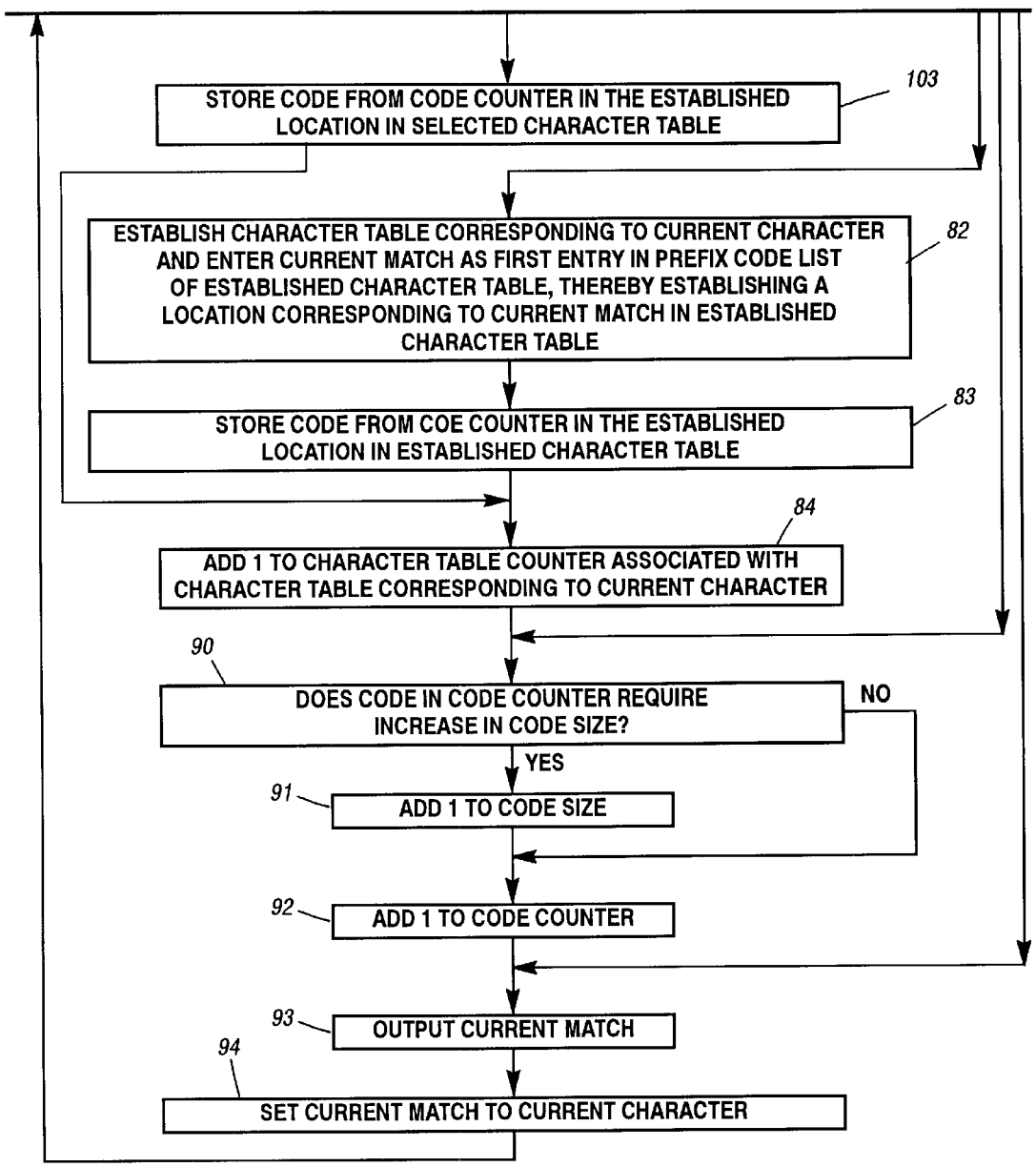
FIG. 2, comprised of FIGS. 2A, 2B, is a control flow chart illustrating the operations executed by the compressor of FIG. 1 so as to perform data compression in accordance with the present invention.

Referring to FIG. 2, with continued reference to FIG. 1, a control flow chart is illustrated showing the detailed operations to be executed by the compressor 10. The control 41 of the compressor 10 is considered as containing appropriate circuitry, such as state machines, or appropriate software, to control execution of the operations. The flow chart of FIG. 2 is predicated on a variable length output and the Code Size register 33 is utilized to this effect. In an ASCII variable length code implementation, the Code Size may begin with 9 bits and sequentially increase to 10, 11 and 12 bits at codes 512, 1024 and 2048, respectively. It is appreciated that a fixed code size may also be utilized with appropriate modifications to the embodiment.

Control enters a block 60 whereat the Code Counter 32 is initialized to a first available code, for example, 258 in the ASCII environment. At a block 61, the Code Size register 33 is initialized to the beginning Code Size, for example, 9 bits in ASCII embodiments. At a block 62, the Current Match register 30, the Character Table Counters 38 and the Character Table Links in the Directory 36 are cleared.

At a block 63, the Length Limit registers 37 are set, either manually or automatically, to appropriate Character Table Length Limits in accordance with the statistics of the input data in a manner to be further described. At a block 64, the Links in the Directory are set to "Exclusion" for those Character Tables to be excluded from the Character Table Structure 13. The Character Table exclusion threshold logic 39 is utilized, in a manner to be described, to set the appropriate Links to "Exclusion" in the Directory 36 in accordance with the statistics of the input data.

Processing proceeds to a block 65 whereat the first input data character is fetched to the Current Match register 30 and, at a block 70, the next input data character is fetched to the Current Character register 31. At a block 71, the Directory 36 is consulted to determine if a Character Table has been established for Current Character. If the Directory 36 indicates that a Link has been assigned to Current Character, the Character Table corresponding to Current Character is selected at a block 72. The Table creation and selection logic 34 is utilized to perform the Table selection.

At a block 73, the Current Match is compared to the Prefix Code List 21 of the selected Character Table to determine if Current Match is in the Prefix Code List. The Prefix Code List may be searched associatively for Current Match or, alternatively, the Prefix Code List may comprise an ordered and linked list of Prefix Codes so as to effect the comparison with Current Match. Other list searching procedures known in the art may be utilized to the same effect. If Current Match is found in the Prefix Code list, the YES branch is taken from the block 73 to a block 74.

At the block 74, the location corresponding to Current Match in the selected Character Table is accessed and, at a block 75 the Current Match register 30 is set to the string code in the accessed location of the selected Character Table. Control then returns to the block 70 to fetch the next input data character to the Current Character register 31 to continue the search for the longest match.

If, at the block 71, a Character Table has not been established for Current Character, the NO branch from the block 71 is taken to a block 80. At the block 80, the code in the Code Counter 32 is tested to determine if all of the string codes have already been assigned. To effect this determination the Counter overflow is examined. If the Code Counter 32 has not overflowed, the NO branch from the block 80 is taken to a block 81. At the block 81, the Directory 36 is examined to determine if the Link for Current Character indicates Table exclusion. If the Character Table corresponding to Current Character is not to be excluded, the NO branch from the block 81 is taken to a block 82.

At the block 82, a Character Table corresponding to Current Character is established and Current Match is entered as the first entry in the Prefix Code List 21 of the established Character Table. This first entry thereby establishes a String Code location 20 corresponding to Current Match in the established Character Table. The Table creation and selection logic 34 and the Character Table Links 35 are utilized, as described above, in establishing the Character Table.

At a block 83, the code from the Code Counter 32 is stored in the established String Code location 20 in the established Character Table. It is appreciated that when the described path through the blocks 71, 80 and 81 to the block 82 is taken, the longest matching string in the Character Table Structure 13 has been determined. Thus, at the block 83, the appropriate extended string is effectively stored in the established Character Table corresponding to Current Character. The Table update logic 40 is utilized in storing the extended string.

At a block 84, the Character Table Counter 38 associated with the Character Table corresponding to Current Character is incremented by 1. Thus, the Character Table Counter associated with the Character Table corresponding to Current Character maintains a count of the strings stored in the Character Table.

If, at the block 73, Current Match is not included in the Prefix Code List of the selected Character Table, the NO branch from the block 73 is taken to a block 100. At the block 100, the Code Counter 32 is tested in the manner described above with respect to the block 80. If the Code Counter 32 has not overflowed, the NO branch from the block 100 is taken to a block 101.

At the block 101, the Character Table Counter 38 associated with the Character Table selected at the block 72 is tested to determine if the count in the Counter is less than the corresponding Character Table Length Limit 37. If the count in the Character Table Counter is less than the corresponding Character Table Length Limit, the YES branch from the block 101 is taken to a block 102.

At the block 102, Current Match in the Current Match register 30 is added to the Prefix Code List 21 of the Character Table selected at the block 72. Thus, at the block 102, a location that corresponds to Current Match is established in the selected Character Table. If the Prefix Code List comprises an ordered and linked list, Current Match is inserted and linked into the Prefix Code List in the appropriate order. At a block 103, the code from the Code Counter 32 is stored in the String Code field 20 in the selected Character Table at the location therein that was established at the block 102.

It is appreciated that when the described path through the blocks 73, 100 and 101 to the block 102 is taken, the longest matching string in the Character Table Structure 13 has been determined. Thus, at the block 103, the appropriate extended string is effectively stored at the location corresponding to Current Match in the Character Table selected at the block 72.

Processing proceeds from the block 103 to the above described block 84 whereat the Character Table Counter associated with the Character Table corresponding to Current Character is incremented by 1.

It is appreciated from the foregoing that the loop comprising the blocks 71–75 sequentially fetches the input data characters that establish or select the corresponding Character Tables to determine if the strings represented by Current Match are stored in the Character Table Structure 13. Thus, the loop comprising the blocks 71–75 searches for the longest matching string in the Character Table Structure. When, as described above, the longest matching string has been determined, the code thereof is in the Current Match register and the mismatching character is in the Current Character register. The extended string comprising the longest match extended by the mismatching character is readily stored in the Character Table Structure by, at the block 83 or 103, inserting the code from the Code Counter into the location corresponding to Current Match in the Character Table corresponding to Current Character.

Control proceeds from the block 84 to a block 90 whereat the code in the Code Counter 32 is tested to determine if an increase in Code Size is required. If so, processing continues to a block 91 whereat the Code Size register 33 is incremented by 1. If an increase in Code Size is not required at the block 90, the block 91 is bypassed to continue processing at a block 92. At the block 92, the Code Counter 32 is incremented by 1.

Control proceeds to a block 93 whereat the code of the Current Match is output as part of the compressed code stream provided at the compressor output 12. The code of the Current Match is provided by the Current Match register 30 and is output utilizing the number of bits denoted by the Code Size register 33. When Current Match is a multiple character string, the code of the string resides in the Current Match register 30 and was the longest match found in the Character Table Structure 13 as described above. It is appreciated that the Current Match output at the block 93 can also be a single character. The output code in this case is the value of the character which is also provided from the Current Match register 30.

Processing proceeds to a block 94 whereat the character in the Current Character register 31 is set into the Current Match register 30. Thus, the Current Match register 30 is set with the character that resulted in the mismatch. Control then returns to the block 70 to begin the next compression cycle with the mismatching character set into the Current Match register 30.

If, at the block 81, the Link for Current Character indicates Table exclusion, the YES branch from the block 81 is taken directly to the block 90 bypassing the Character Table creation and updating as well as the Character Table Counter updating of the blocks 82–84. If, at the block 101, the Character Table Counter associated with the selected Character Table is not less than the corresponding Character Table Length Limit, the NO branch from the block 101 is taken directly to the block 90 bypassing the Character Table updating and Character Table Counter updating of the blocks 102, 103 and 84.

If, at the block 80 or 100, the Code Counter 32 has overflowed, the YES branch from the block 80 or the block 100 is taken directly to the block 93 bypassing the Character Table creation and updating as well as the updating of the Character Table Counters. When this occurs the incrementing of the Code Counter at the block 92 is also bypassed.

Referring to FIG. 3, with continued reference to FIGS. 1 and 2, an example of the operation of the compressor 10 in accordance with the flow chart of FIG. 2 is illustrated. At the top of FIG. 3, an input data character stream is shown where sequential characters are identified by character sequence numbers. This is done to facilitate following the progress of the characters through the steps of the example. It is appreciated that the sequence numbers are shown for purposes of character identification and do not appear in the actual data character stream.

The example is largely self-explanatory, with the actions performed delineated in the left-hand column and the blocks of FIG. 2 that participate in the actions designated in the right-hand column. The established or selected Character Table corresponding to Current Character is indicated in the Character Table column with the Current Character value denoted in the Current Character column. The Character Table Prefix Code fields, the Character Table String Code fields and the Character Table counters are illustrated in the respective columns as indicated. When, at the block 73 of FIG. 2, Current Match is in the Prefix Code List of the selected Character Table, the string code stored in the location corresponding to Current Match is indicated in parenthesis.

A small alphabet size and Code Counter capacity are utilized in the example so that a complete cycle of string code assignment and Code Counter overflow can be illustrated. A 4 character alphabet having a 2 bit character size is utilized with the characters denoted as a, b, x and y. The numerical values of the 2 bit characters are 0, 1, 2 and 3. The Code Counter 32 is 4 bits wide capable of counting up to 15 prior to overflow. When the Code Counter is at a count of 15, the next increment of 1 results in a counter overflow. Since the character values are 0–3, the Code Counter is initialized to a count of 5. The count of 4 is not utilized in the example and may be reserved as a control code. The multiple character string codes, therefore, are the codes 5 through 15 requiring a maximum string code width of 4 bits.

Thus, in a complete string storage cycle of the compressor example of FIG. 3, the Code Counter 32 can assign 11 string codes prior to overflow and the lengths of the Character Tables corresponding to the characters a, b, x and y will have a total of 11 locations for string storage. For the purposes of the example, the Character Table Length Limit registers 37 for the Character Tables corresponding to the characters a, b and x are set to 5, 5 and 1, respectively, with the Link for character z in the Directory 36 set to Table exclusion.

It is appreciated that although the example Character Tables only have a capacity of 11 strings, in a practical embodiment the Character Table Structure will be significantly larger holding, for example, 4K strings.

In action 1, the Code Counter is set to the first available code of 5 at the block 60 of FIG. 2. Pursuant to blocks 65, 70, 71 and 80–83, the "b" Character Table is established and the string "ab" stored therein with a String Code of 5. In action 1, the Character Table Counter corresponding to the "b" Character Table is incremented to 1 at the block 84 of FIG. 2.

In actions 2 and 4, the "a" and "x" Character Tables are established, respectively. In actions 6 and 7 the string "bab" is stored in the "b" Character Table with a string code of 9.

In action 9, a string terminating in the character "x" is excluded from storage in the "x" Character Table because, pursuant to the block 101 of FIG. 2, the Character Table Counter associated with the "x" Character Table was not less than the Character Table Length Limit of 1. It is seen in action 4 that the Character Table Counter for the "x" Character Table is already incremented to 1.

In action 16, a string terminating in the character "z" is excluded from storage because, pursuant to the block 81 of FIG. 2, the Link for the character "z" indicates Table exclusion.

In action 18, the Code Counter 32 overflows and, in action 20, the overflow is detected at the block 100 of FIG. 2. As a consequence, in action 21, the longest match string code of 13 is output at the block 93 of FIG. 2.

In the embodiment described herein, after the last input data character has been fetched, the value in the Current Match register 30 is output as the last compressed code. Thus, in action 22, the last character of the exemplified input data character stream is output as illustrated.

More detailed descriptions of the actions of FIG. 3 relative to the blocks of FIG. 2 are readily apparent and will not be provided for brevity.

The Character Table Length Limit registers 37 and the Links in the Directory 36 may be configured as follows. The Length Limits set into the registers 37 are determined in accordance with the frequency of occurrence of the characters of the alphabet over which compression is being performed. Such frequency of occurrence statistics may be found in the One-Grams developed for the alphabet characters of the input data. Procedures for developing One-Grams are well known. For example, One-Grams developed for English statistics is found on page 263 of the textbook "*Data Compression: Methods And Theory*" by James A. Storer, Computer Science Press, Inc., 1988. The total locations available for the Character Tables are distributed to the Tables in accordance with the frequency of occurrence of the characters corresponding to the Character Tables. Accordingly, appropriate Length Limits are set into the registers 37. Character Tables for frequently occurring characters are therefore longer than Character Tables for infrequently occurring characters.

As a further feature of the present invention, Character Tables may be excluded if the number of locations allocated thereto are below a predetermined threshold. For example, a Character Table that can store only one or two strings may be excluded. As described above, the Character Table exclusion threshold logic 39 may be utilized to set the Links in the Directory 36 for the Tables to be excluded to a value indicating Table exclusion. It is appreciated that, alternatively, the registers 37 for such Tables may be set to zero so that the Table exclusion will effectively be performed at block 101 of FIG. 2.

When a Character Table is excluded, the locations that might otherwise have been assigned thereto are distributed, as appropriate, to the non-excluded Tables.

The number of locations to be distributed among the Character Tables is determined from the parameters of the Code Counter 32. The number of Character Table locations to be distributed is equal to the number of string codes that are assigned by the Code Counter beginning with the first available code (FIG. 2, block 60) to the maximum code prior to Counter overflow. In the ASCII environment, with a 12 bit Code Counter, over 3800 locations are distributed to the Character Tables.

Figure 4:
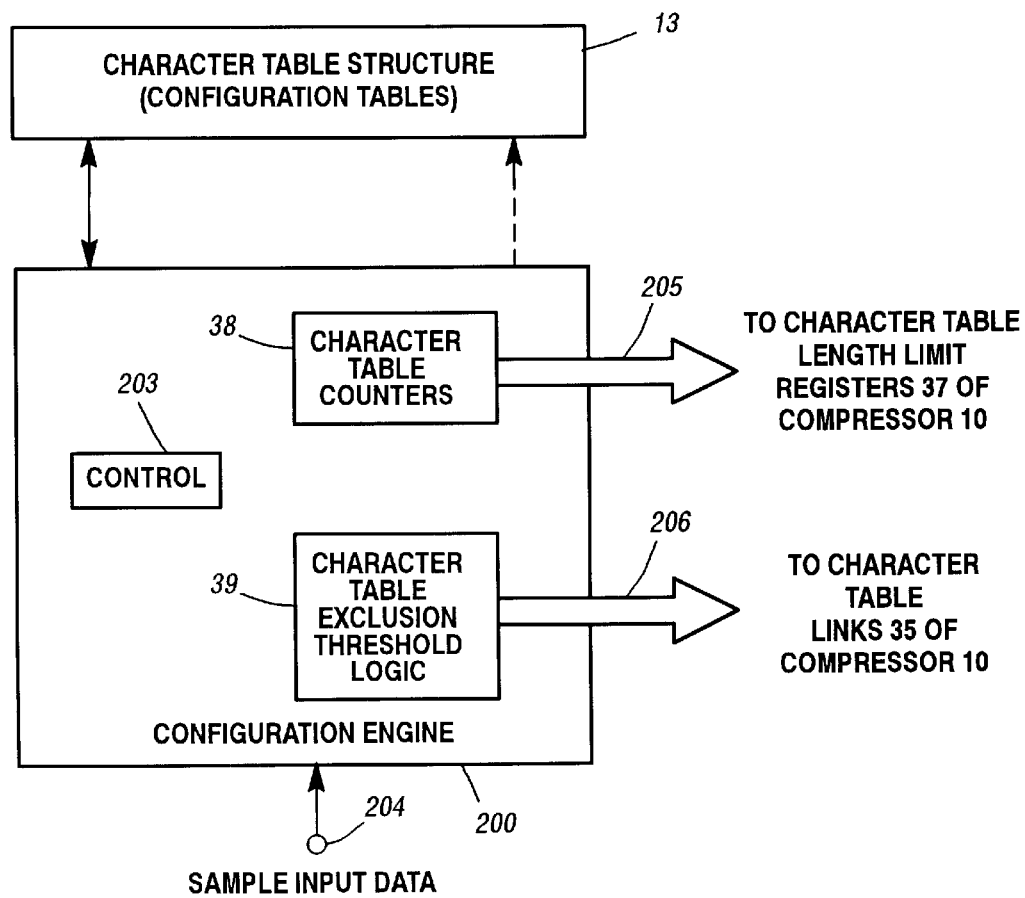
FIG. 4 is a schematic illustration of an engine for configuring the compressor of FIG. 1.

Referring to FIG. 4, with. continued reference to FIGS. 1 and 2, apparatus similar to that described above with respect to FIGS. 1 and 2 can he utilized, with minor modification, as a configuration engine 200 for configuring the compressor 10. With each of the Length Limit registers set to an appropriately large number and with no Links in the Directory set to exclusion, the engine 200 can absorb a body of sample data at an input 204 until the Code Counter overflows. When this occurs, the values in the Character Table Counters are transferred, via a bus 205, to the corresponding Length Limit registers 37 in the compressor 10. Additionally, appropriate Links in the Directory 36 may be set to Table exclusion, via a bus 206, utilizing the logic 39. The configuration engine 200 may operate separately, independently and in parallel with the compressor 10 for efficiency. Control 203 provides the appropriate configuration control signals.

It is appreciated that in the operation of the above described compressor, when a Character Table is full, no further strings can be stored therein with subsequently occurring strings being stored in the Character Tables in which space still exists. In this manner only a limited number of strings ending in infrequently occurring characters, and extensions thereof, are stored in the Character Table Structure. It is believed that an enhanced set of strings will be stored in the Character Table Structure utilizing the construction of the present invention than are stored in the dictionaries of compressors of conventional design.

In said patent applications Ser. No. 09/688,602 and Ser. No. 09/801,358, strings in an exclusion table are excluded from storage in the compressor dictionaries. It is believed that the Character Table architecture described above provides a simpler implementation for string exclusion.

It is appreciated that the compressed code output provided by the embodiment of FIGS. 1 and 2 is compatible with standard LZW decompressors and the data character stream corresponding to the compressed code output can be recovered thereby.

Although the above described embodiment of the invention is LZW based, it is appreciated that the present invention can be utilized with other known dictionary based compression methodologies. It is further appreciated that the above described embodiment of the invention may be implemented in hardware, firmware, software or a combination thereof. Discrete circuit embodiments may readily be implemented for performing the various described functions. In a software embodiment, appropriate modules programmed with coding readily generated from the above descriptions may be utilized.

While the invention has been described in its preferred embodiment, it is to be understood that the words which have been used are words of description rather than of limitation and that changes may be made within the purview of the appended claims without departing from the true scope and spirit of the invention in its broader aspects.

What is claimed is:

1. A data compression method for compressing an input stream of data characters into an output stream of compressed codes, said data characters being from an alphabet of data characters, comprising providing a plurality of character tables corresponding to respective characters of said alphabet, limiting the lengths of said character tables in accordance with frequency of occurrence of said characters of said alphabet, respectively, storing in said character tables, strings of data characters encountered in said input stream, said stored strings having respective codes associated therewith, a string comprising a prefix string of at least one of said characters followed by an extension character, a particular string being stored in said character tables by storing the code associated with said particular string in the character table corresponding to the extension character of said particular string at a character table location corresponding to the code of the prefix string of said particular string, searching said input stream by comparing said input stream to said stored strings to determine the longest match therewith, outputting the code associated with said longest match so as to provide said output stream of compressed codes, inserting an extended string into said character tables, said extended string comprising said longest match extended by the next data character in said input stream following said longest match, said extended string being stored in the particular character table corresponding to said next data character, and bypassing said inserting step if said particular character table is unavailable for string storage, thereby excluding said extended string from storage.

2. The method of claim 1 wherein said bypassing step comprises bypassing said inserting step if said particular character table is full.

3. The method of claim 2 further comprising providing a plurality of character table counters corresponding to said plurality of character tables, respectively, providing a plurality of character table length limits corresponding to said plurality of character tables, respectively, incrementing the character table counter associated with said particular character table when said extended string is inserted therein, and wherein said bypassing step comprises bypassing said inserting step if said character table counter corresponding to said particular character table has attained the character table length limit associated with said particular character table.

4. The method of claim 3 further comprising configuring said character table length limits utilizing a sample input stream of data characters.

5. The method of claim 4 herein said configuring step comprises
- providing a plurality of configuration tables corresponding to said plurality of character tables,
- storing in said configuration tables, configuration strings of data characters encountered in said sample input stream, said configuration strings having respective codes assigned thereto from a code counter,
- a particular configuration string being stored in said configuration tables by storing the code associated with said particular configuration string in the configuration table corresponding to the extension character of said particular configuration string at a configuration table location corresponding to the code of the prefix string of said particular configuration string,
- searching said sample input stream by comparing said sample input stream to said stored configuration strings to determine the longest match therewith,
- inserting an extended configuration string into said configuration tables, said extended configuration string comprising said longest match extended by the next data character in said sample input stream following said longest match, said extended configuration string being stored in the particular configuration table corresponding to said next data character,
- assigning a code from said code counter to said stored extended configuration string and incrementing said code counter to a next available code,
- providing respective counts of the number of strings stored in said configuration tables when said code counter has overflowed, and
- providing said counts to said character table length limits, respectively, so as to configure said character table length limits.

6. The method of claim 5 wherein said configuring step further includes
- determining which of said counts are below a predetermined threshold so as to provide character table exclusion indications, and
- providing said character table exclusion indications to determine character tables to be excluded from creation.

7. The method of claim 1 wherein said bypassing step comprises
- bypassing said inserting step if said particular character table is an excluded table.

8. The method of claim 7 further comprising
- providing a directory comprising links to said character tables indexed by said respective characters of said alphabet,
- setting a link of said directory to table exclusion when the character table corresponding to said link is limited to a length less than a predetermined threshold, and wherein said bypassing step comprises
- bypassing said inserting step when the link associated with said particular character table is set to table exclusion.

9. The method of claim 1 further comprising
- utilizing a code counter for providing the codes associated with said strings of data characters stored in said character tables, and
- incrementing said code counter to a next available code when said extended string is inserted into said character tables and when said inserting step is bypassed.

10. The method of claim 6 further including
- detecting when said code counter has overflowed, and wherein said bypassing step comprises
- bypassing said inserting step when said code counter has overflowed.

11. The method of claim 1 wherein a character table includes a list of prefix codes corresponding to respective locations of said character table.

12. The method of claim 11 wherein said searching step includes
- (a) matching one of said stored strings thereby providing a current match,
- (b) fetching the next data character from said input stream following said current match thereby providing a current character,
- (c) determining if said current match is one of the prefix codes in the prefix code list of said character table corresponding to said current character, and
- (d) if said current match is one of said prefix codes, setting said current match to the code stored in the character table location corresponding to said one of said prefix codes and repeating steps (b) through (d) until said current match of step (c) is determined not to be one of said prefix codes in said prefix code list,
- thereby determining said longest match.

13. The method of claim 12 wherein, if in step (c) said current match is determined not to be one of said prefix codes in said prefix code list, said inserting step includes
- storing said current match in said prefix code list of said character table corresponding to said current character, thereby establishing a location corresponding to said current match in said character table corresponding to said current character,
- providing a next available string code, and
- storing said next available string code in said established location,
- thereby inserting said extended string into said character table corresponding to said current character.

14. The method of claim 12 wherein, if in step (c) said current match is determined not to be one of said prefix codes in said prefix code list,
- said outputting step comprises outputting said current match.

15. The method of claim 14 wherein said compression method operates in compression cycles, further including
- setting said current match to said current character in preparation for performing a next compression cycle.

16. The method of claim 1 further comprising
- creating a character table when the character corresponding thereto is first encountered.

17. The method of claim 8 further comprising
- providing a directory comprising links to said character tables indexed by said respective characters of said alphabet,
- setting a link of said directory to table exclusion when the character table corresponding to said link is limited to a length less than a predetermined threshold, and
- bypassing said creating step when the link corresponding to a character table to be created is set to table exclusion.

18. Data compression apparatus for compressing an input stream of data characters into an output stream of compressed codes, said data characters being from an alphabet of data characters, comprising a plurality of character tables corresponding to respective characters of said alphabet for storing strings of data characters encountered in said input stream, said stored strings having respective codes associated therewith, a string comprising a prefix string of at least one of said characters followed by an extension character, a particular string being stored in said character tables by storing the code associated with said particular string in the character table corresponding to the extension character of said particular string at a character table location corresponding to the code of the prefix string of said particular string, means for limiting the lengths of said character tables in accordance with frequency of occurrence of said characters of said alphabet, respectively, means for searching said input stream by comparing said input stream to said stored strings to determine the longest match therewith, means for outputting the code associated with said longest match so as to provide said output stream of compressed codes, means for inserting an extended string into said character tables, said extended string comprising said longest match extended by the next data character in said input stream following said longest match, said extended string being stored in the particular character table corresponding to said next data character, and means for bypassing the inserting of said extended string into said character tables if said particular character table is unavailable for string storage, thereby excluding said extended string from storage.

19. The apparatus of claim 18 wherein said bypassing means comprises means for bypassing the inserting of said extended string into said character tables if said particular character table is full.

20. The apparatus of claim 19 further comprising a plurality of character table counters corresponding to said plurality of character tables, respectively, a plurality of character table length limits corresponding to said plurality of character tables, respectively, means for incrementing the character table counter associated with said particular character table when said extended string is inserted therein, and wherein said bypassing means comprises means for bypassing the inserting of said extended string into said character tables if said character table counter corresponding to said particular character table has attained the character table length limit associated with said particular character table.

21. The apparatus of claim 20 further comprising means for configuring said character table length limits utilizing a sample input stream of data characters.

22. The apparatus of claim 21 wherein said configuring means comprises a plurality of configuration tables corresponding to said plurality of character tables for storing configuration strings of data characters encountered in said sample input stream, said configuration strings having respective codes assigned thereto from a code counter, a particular configuration string being stored in said configuration tables by storing the code associated with said particular configuration string in the configuration table corresponding to the extension character of said particular configuration string at a configuration table location corresponding to the code of the prefix string of said particular configuration string, means for searching said sample input stream by comparing said sample input stream to said stored configuration strings to determine the longest match therewith, means for inserting an extended configuration string into said configuration tables, said extended configuration string comprising said longest match extended by the next data character in said sample input stream following said longest match, said extended configuration string being stored in the particular configuration table corresponding to said next data character, means for assigning a code from said code counter to said stored extended configuration string and incrementing said code counter to a next available code, means for providing respective counts of the number of strings stored in said configuration tables when said code counter has overflowed, and means for providing said counts to said character table length limits, respectively, so as to configure said character table length limits.

23. The apparatus of claim 22 wherein said configuring means further includes means for determining which of said counts are below a predetermined threshold so as to provide character table exclusion indications, and means for providing said character table exclusion indications to determine character tables to be excluded from creation.

24. The apparatus of claim 18 wherein said bypassing means comprises means for bypassing the inserting of said extended string into said character tables if said particular character table is an excluded table.

25. The apparatus of claim 24 further comprising a directory comprising links to said character tables indexed by said respective characters of said alphabet;

means, for setting a link of said directory to table exclusion when the character table corresponding to said link is limited to a length less than a predetermined threshold, and wherein said bypassing means comprises means for bypassing the inserting of said extended string into said character tables when the link associated with said particular character table is set to table exclusion.

26. The apparatus of claim 18 further comprising a code counter for providing the codes associated with said strings of data characters stored in said character tables, and means for incrementing said code counter to a next available code when said extended string is inserted into said character tables and when said inserting of said extended string into said character tables is bypassed.

27. The apparatus of claim 26 further including means for detecting when said code counter has overflowed, and wherein said bypassing means comprises means for bypassing the inserting of said extended string into said character tables when said code counter has overflowed.

28. The apparatus of claim 18 further comprising means for creating a character table when the character corresponding thereto is first encountered.

29. The apparatus of claims 28 further comprising a directory comprising links to said character tables indexed by said respective characters of said alphabet, means for setting a link of said directory to table exclusion when the character table corresponding to said link is limited to a length less than a predetermined threshold, and wherein said bypassing means comprises means for bypassing the creating of a character table when the link corresponding to the character table to be created is set to table exclusion.

30. The apparatus of claim 18 wherein a character table includes a list of prefix codes corresponding to respective locations of said character table.

31. The apparatus of claim 30 wherein said searching means comprises means operative for (a) matching one of said stored strings thereby providing a current match, (b) fetching the next data character from said input stream following said current match thereby providing a current character, (c) determining if said current match is one of the prefix codes in the prefix code list of said character table corresponding to said current character, and (d) if said current match is one of said prefix codes, setting said current match to the code stored in the character table location corresponding to said one of said prefix codes and repeating (b) through (d) until said current match of (c) is determined not to be one of said prefix codes in said prefix code list, thereby determining said longest match.

32. The apparatus of claim 31 wherein said inserting means includes means for storing said current match in said prefix code list of said character table corresponding to said current character, thereby establishing a location corresponding to said current match in said character table corresponding to said current character, means for providing a next available string code, and means for storing said next available string code in said established location, thereby inserting said extended string into said character table corresponding to said current character.

33. The apparatus of claim 31 wherein said outputting means comprises means for outputting said current match.

34. The apparatus of claim 33 wherein said apparatus operates in compression cycles, further including means for setting said current match to said current character in preparation for performing a next compression cycle.

* * * * *